(12) United States Patent
Murakawa et al.

(10) Patent No.: US 8,559,697 B2
(45) Date of Patent: Oct. 15, 2013

(54) MASK INSPECTION APPARATUS AND IMAGE GENERATION METHOD

(75) Inventors: Tsutomu Murakawa, Tokyo (JP); Yoshiaki Ogiso, Tokyo (JP)

(73) Assignee: Advantest Corp., Tokyo (JP)

( * ) Notice: Subject to any disclaimer, the term of this patent is extended or adjusted under 35 U.S.C. 154(b) by 194 days.

(21) Appl. No.: 13/066,274

(22) Filed: Apr. 11, 2011

(65) Prior Publication Data

US 2011/0249885 A1 Oct. 13, 2011

(30) Foreign Application Priority Data

Apr. 12, 2010 (JP) ................................. 2010-091555

(51) Int. Cl.
*G06K 9/00* (2006.01)
(52) U.S. Cl.
USPC ........... 382/144; 382/141; 382/142; 382/143; 382/145; 382/147
(58) Field of Classification Search
USPC .................................................. 382/141–152
See application file for complete search history.

(56) References Cited

U.S. PATENT DOCUMENTS

| 6,990,385 | B1 * | 1/2006 | Smith et al. ................... 700/110 |
| 2001/0022346 | A1 | 9/2001 | Katagami et al. |
| 2006/0171593 | A1 * | 8/2006 | Hayakawa et al. ........... 382/209 |
| 2008/0042060 | A1 * | 2/2008 | Nakasuji et al. .............. 250/310 |
| 2010/0196804 | A1 * | 8/2010 | Murakawa et al. ................ 430/5 |
| 2011/0286656 | A1 * | 11/2011 | Kulkarni et al. .............. 382/144 |

FOREIGN PATENT DOCUMENTS

JP 2000-294183 10/2000

OTHER PUBLICATIONS

Brown et al. "Recognising Panorama", Proc. of 9th IEEE International Conference on Computer Vision, 2, 2003, 1218-1225.

* cited by examiner

*Primary Examiner* — Ruiping Li
(74) *Attorney, Agent, or Firm* — Muramatsu & Associates

(57) ABSTRACT

A mask inspection system includes irradiation means for irradiating a sample with an electron beam, electron detection means for detecting a quantity of electrons generated from the sample, image processing means, storage means, and control means for determining divided areas in such a way that divided images adjacent to each other overlap with each other, and acquiring the divided images of the respective divided areas. The control means extracts two divided images adjacent to each other in a predetermined sequence, then detects an image of a same pattern formation area included in an overlap area, and determines the detected image to be a combination reference image. The control means then combines the two divided images adjacent to each other on the basis of the combination reference image to thereby form an entire SEM image of the observed area.

12 Claims, 14 Drawing Sheets

MASK INSPECTION APPARATUS AND IMAGE GENERATION METHOD

CROSS-REFERENCE TO RELATED APPLICATIONS

This application is based upon and claims the benefits of priority of the prior Japanese Patent Application No. 2010-091555, filed on Apr. 12, 2010, the entire contents of which are incorporated herein by reference.

BACKGROUND OF THE INVENTION

1. Field of the Invention

The embodiment discussed herein is related to a mask inspection apparatus having a function to generate a wide field of view and high definition image and also to an image generation method.

2. Description of the Related Art

In a lithography process of semiconductor manufacturing processes, a pattern formed on a photomask is exposed to light to be transferred onto a wafer by use of an exposure device. If the pattern formed on the photomask has a defect or distortion, such a defect or distortion causes a failure to transfer the pattern at a desired position, a failure to form the pattern into an accurate shape or the like, i.e., causes a reduction in accuracy of the exposure. In order to prevent such a reduction in accuracy of the exposure, an inspection is conducted to find a positional error and a defect in a photomask.

As a method of inspecting photomasks, there is an inspection method using an SEM image of a mask captured with a scanning electron microscope. In the scanning electron microscope, a sample is irradiated with incident electrons while the surface of the sample in an electron beam scanning region is scanned by the incident electrons, and secondary electrons emitted from the sample are acquired through a scintillator. Thereafter, the quantity of the acquired electrons is converted into luminance to acquire SEM image data. Then, the SEM image data is displayed on a display.

For example, an inspection using a line width of a pattern formed on a mask is conducted by the following procedures. A predetermined region of a pattern formed on a photomask is displayed on a display. Then, an electron beam is aimed at and applied onto a measurement point set within the display region. Thereafter, a luminance distribution waveform is acquired on the basis of secondary electrons reflected from the measurement point. Thereafter, pattern edge positions are found by conducting analysis on the luminance distribution waveform to thereby define them as the line width. Whether or not the line width thus found falls within a tolerance range is determined to judge whether the quality of the photomask is good or not.

In addition, there is a mask inspection method in which a mask and a mask model are compared with a result of a transfer simulation onto a wafer. In this mask inspection method, a simulation to find how a pattern is transferred onto a wafer is performed on the basis of an inspection image obtainable from transmitted light and reflected light using a mask. Then, the result of the simulation is compared with a result of a simulation performed to find how the pattern is transferred onto the wafer with a correct mask. It results in inspecting whether or not a defect exists in the pattern on the mask, and so on. This transfer simulation requires a field of view of approximately 10 micron, and the mask model and an SEM image are compared to inspect whether or not a defect exists in the pattern formed on the mask, and so on. The pattern of the entire photomask is reflected to this mask model. Thus, the SEM image for comparison with the mask model is required to be a wide field of view, as well.

In the mask inspection apparatus using the aforementioned scanning electron microscope or the like, however, highly accurate measurement is required. For this reason, in general, an SEM image is acquired by using a limited, narrow field of view with a high magnification. Moreover, in a case of a normal length measurement SEM, scanning with a wide field of view causes aberrations such as astigmatism, field curvature and distortion, and therefore requires dynamic adjustment of such aberrations during the scanning. Therefore, this inspection apparatus not only causes a significant load for correction, but also results in a situation where the aberrations are not sufficiently corrected.

In this respect, Japanese Laid-open Patent Publication No. 2000-294183 describes a technique to acquire a wide field patched image of a sample with an SEM while automatically driving a sample stage at the time of capturing divided SEM images of the sample.

As described above, in order to acquire a wide field SEM image, SEM images are captured in a divided manner and the captured SEM images are patched together.

However, with the technique described in Japanese Publication No. 2000-294183, when moving the sample stage to a divided area, there is no guarantee to move it to the correct position. Thus, even when patched images are captured, there is no guarantee that the images are combined into a single wide field image.

In addition, when the SEM images acquired in a divided manner are patched together, the operator detects target images for joining two areas together, and then combines the two areas in such a way that the two target images are connected to each other. Accordingly, generation of a high definition SEM image requires enormous time and efforts.

SUMMARY OF THE INVENTION

The present invention has an object to provide a mask inspection apparatus and an image generation method by which an SEM image with wide field of view and high definition can be easily created at a high speed.

The above problem is solved by a mask inspection apparatus including irradiation means for irradiating a sample with an electron beam, electron detection means for detecting a quantity of electrons generated from the sample having a pattern formed thereon by the irradiation with the electron beam, image processing means for generating image data of the pattern on the basis of the quantity of the electrons, storage means for storing therein the image data, and control means for calculating the number of divided images forming an entire combined image on the basis of a size of a specified observed area of the sample, determining divided areas in such a way that the divided images adjacent to each other overlap with each other, acquiring the divided images of the respective divided areas, and storing the divided images in the storage means. In the mask inspection apparatus, the control means extracts the divided images adjacent to each other in a predetermined sequence starting from a specified one of the divided images of the respective divided areas stored in the storage unit, detects, for each two of the divided images adjacent to each other, an image of a common pattern formation area included in an overlap area between the divided images, determines the detected image to be a combination reference image, and combines the two of the divided images adjacent to each other on the basis of the combination reference image to thereby form an entire SEM image of the observed area.

In the mask inspection apparatus according to this aspect, from the overlap area of the two divided images adjacent to each other, the control means may detect an image of an area having image information equivalent to image information of an area specified in the specified one of the divided images, the control means may measure coordinate data of a periphery of the pattern formation area in each of the adjacent divided images before combining the divided images, the control means may correct the coordinate data of the periphery of the pattern formation area included in each of the two divided images adjacent to each other on the basis of coordinate data of the combination reference image when combining the two divided images adjacent to each other, and, when a plurality of pattern formation areas exist in each of the divided areas, and two divided images adjacent to each other are defined as a divided image A and a divided image B to be combined with the divided image A, the control means may set an image of the pattern formation area as the combination reference image, the pattern formation area lying over a frame of the divided image A on a side adjacent to the divided image B.

Another aspect of the present invention is an image generation method implemented in the mask inspection apparatus according to the above-described configuration. The image generation method according to this aspect includes the steps of calculating the number of divided images, which forms an entire combined image, on the basis of a size of a specified observed area of the sample, and determining divided areas in such a way that divided images adjacent to each other overlap with each other, acquiring the divided images of the respective divided areas, extracting one specified divided image from the divided images of the respective divided areas, extracting two divided images adjacent to each other in a predetermined sequence starting from the extracted divided image, for each of the extracted two divided images adjacent to each other, determining a combination reference image by detecting an image of a same pattern formation area included in an overlap area between the adjacent divided images, combining the two divided images adjacent to each other on the basis of the combination reference image, and generating an entire SEM image.

In the image generation method noted above, in the step of determining the combination reference image, an image of an area having image information equivalent to image information of an area specified in the specified one of the divided images may be detected from the overlap area of the two divided images adjacent to each other which is set as the combination reference image, a step of measuring coordinate data of a periphery of a pattern formation area in each of the adjacent divided images before the step of combining the divided images may be further included, and the step of combining the divided images may include a step of, when a plurality of pattern formation areas exist in each of the divided areas, and the two divided images adjacent to each other are defined as a divided image A and a divided image B to be combined with the divided image A, setting an image of the pattern formation area as the combination reference image, the pattern formation area lying over a frame of the divided image A on a side adjacent to the divided image B.

DESCRIPTION OF THE PREFERRED EMBODIMENT

An embodiment of the present invention is described below with reference to the drawings.

First, a configuration of a scanning electron microscope used as a mask inspection apparatus is described. Next, measurement of a pattern size using an SEM image in general is described. Then, acquisition of SEM image with wide field of view and high accuracy is described.

(Configuration of Scanning Electron Microscope)

Figure 1:
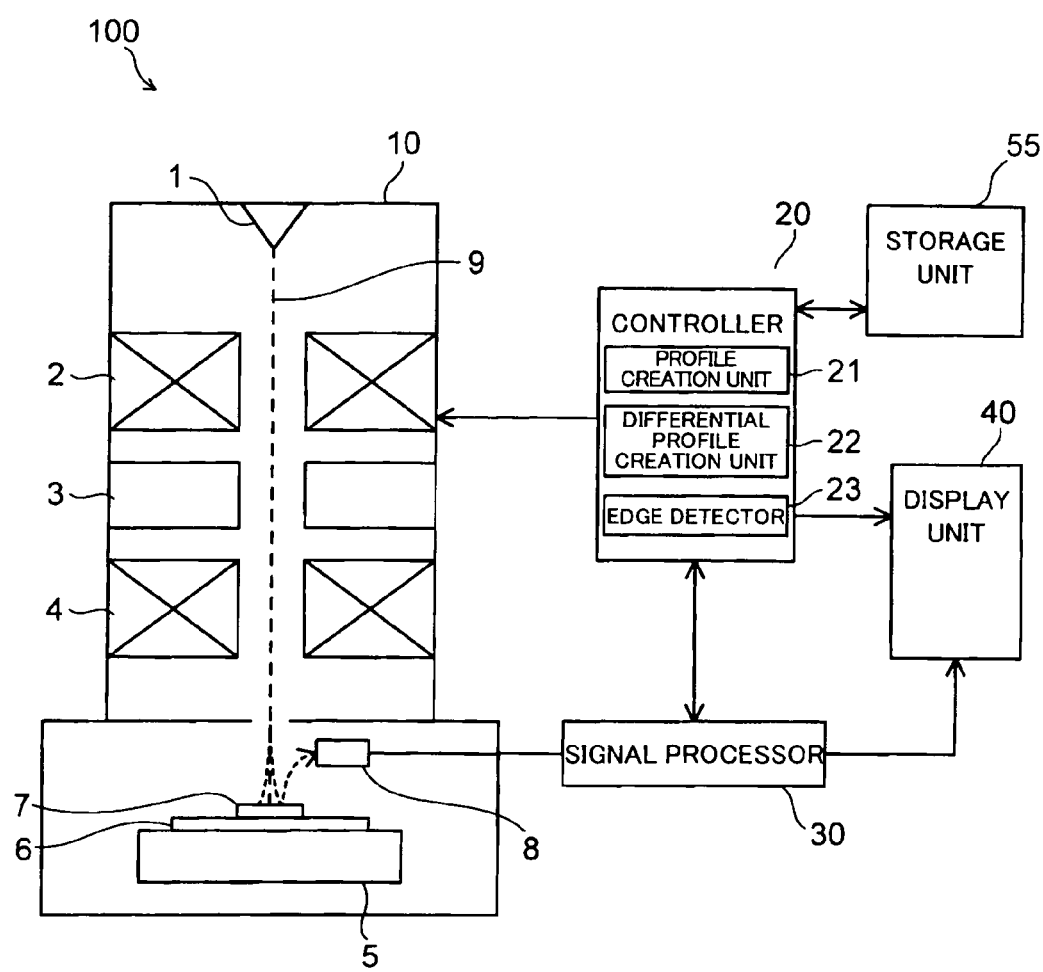
FIG. 1 is a configuration diagram of a scanning electron microscope used in an embodiment of the present invention.

FIG. 1 is a configuration diagram of a scanning electron microscope according to this embodiment.

The scanning electron microscope 100 mainly includes an electron scanning unit 10, a signal processor 30, a display unit 40, a storage unit 55, and a controller 20 configured to control each of the electron scanning unit 10, the signal processor 30, the display unit 40 and the storage unit 55. The controller 20 has a profile creation unit 21, a differential profile creation unit 22 and an edge detector 23.

The electron scanning unit 10 has an electron gun 1, a condenser lens 2, a deflection coil 3, an objective lens 4, a movable stage 5 and a sample holder 6.

A sample 7 on the movable stage 5 is irradiated with charged particles 9 emitted from the electron gun 1 through the condenser lens 2, the deflection coil 3 and the objective lens 4.

The sample 7 is irradiated with the charged particles 9 (primary electron beam) while being scanned in two dimensions. As a result, secondary electrons are emitted from that irradiated portion and detected by an electron detector 8 configured of a scintillator or the like. The quantity of the secondary electrons thus detected is converted into a digital quantity by an AD converter of the signal processor 30 and then stored in the storage unit 55 as image data. The image data is converted into luminance signals and then displayed on the display unit 40. The image data is arranged on a two dimensional array so as to be arranged at the same position as the scanning position of the primary electron beam on the sample 7. In this manner, a two-dimensional digital image is obtained. Each pixel of the two-dimensional digital image expresses luminance data with 8-bit information.

In addition, the signal processor 30 functions as an image processor to process the image data and performs processing to combine SEM images acquired in divided areas as will be described later.

The controller 20 controls the electron-deflection amount of the deflection coil 3 and the image-scanning amount of the display unit 40. In addition, the controller 20 stores therein a program relating to execution of edge detection of a pattern and combination processing for an SEM image with wide field of view.

The profile creation unit 21 creates line profiles showing luminance signals of SEM image data in a specified region. Each line profile shows a luminance signal corresponding to the quantity of the secondary electrons.

The differential profile creation unit 22 subjects the line profile to primary differential processing to create a primary differential profile.

The edge detector 23 detects edges of a pattern from the line profile and the primary differential profile.

(Measurement of Pattern Size Using SEM Image in General)

Next, a description is given of measurement of a pattern size using an SEM image. The measurement is carried out using the scanning electron microscope 100 illustrated in FIG. 1, and includes the edge detection of a pattern in a sample illustrated in FIG. 2A.

Figure 2A:
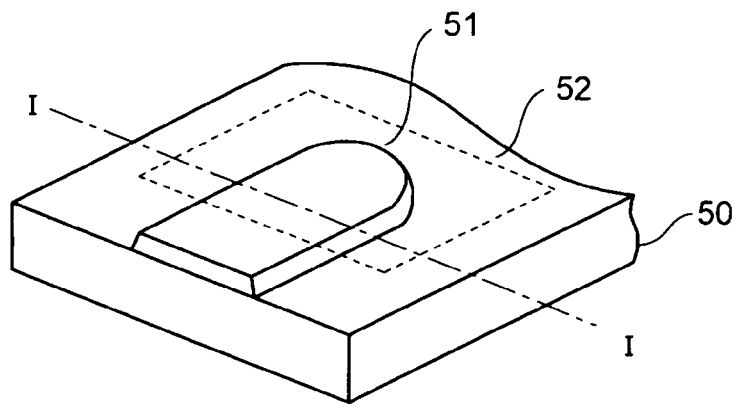
FIGS. 2A to 2D are diagrams for describing an electron image and profiles acquired by a signal processor.

The target is the sample 7 in which a wiring pattern 51 is formed on a photomask substrate 50 as illustrated in FIG. 2A. A part of the sample 7 includes a planar surface as illustrated in FIG. 2A. Here, the portion surrounded by a broken line 52 is an observed area of the scanning electron microscope 100.

Figure 2B:
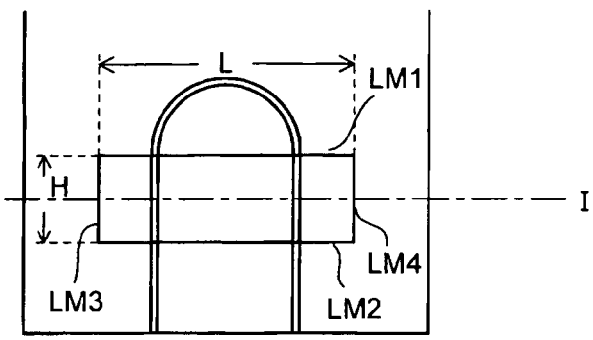

FIG. 2B illustrates an example of an SEM image displayed. The SEM image displayed is acquired by scanning the sample with the electron beam, detecting the quantity of emitted secondary electrons or the like by the electron detector 8, converting the detected quantity of the electrons into luminance signals, and displaying the SEM image produced from the luminance signals while synchronizing electron beam scanning and scanning of the display (display unit 40).

A length measurement area is specified on the SEM image illustrated in FIG. 2B, and a corresponding SEM image is extracted therefrom. The length measurement area is set to be an area having a width H equal to 400 pixels and a length L, for example. The operator selects this area by an upper line marker LM1, a lower line marker LM2, a left line marker LM3 and a right line marker LM4.

The extracted SEM image pixel data is divided into areas with respect to the direction H of the length measurement area, and a line profile corresponding to luminance distribution is found for each of the divided areas. Note that, when the line profile is to be found, it is possible to reduce noise components by performing smoothing processing in the length L direction with a three-pixel width, for example.

Figure 2C:
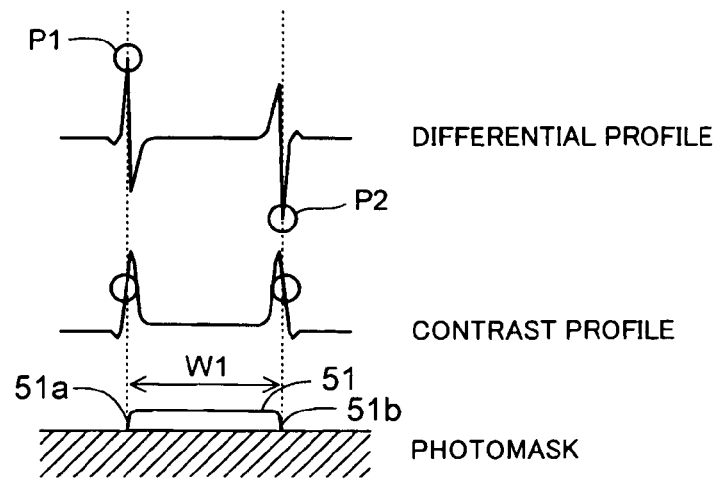

FIG. 2C is a diagram illustrating a line profile corresponding to the quantity of the secondary electrons emitted from the sample, which can be acquired upon irradiation with an electron beam along the I-I line of FIG. 2A. As illustrated in FIG. 2C, the line profile (contrast profile) drastically changes at the edge portions of the pattern. In order to find the position where the profile drastically changes, the line profile is differentiated to find the maximum peak and the minimum peak of the amount of differential signal.

Figure 2D:
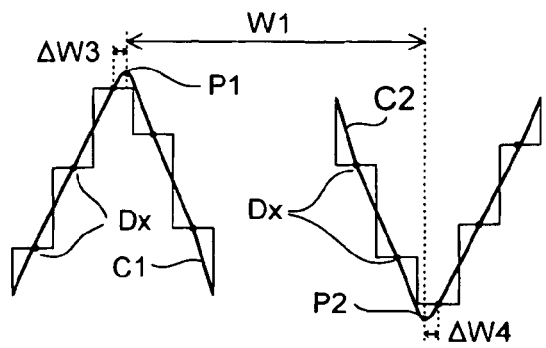

Furthermore, as illustrated in FIG. 2D, differential waveforms C1 and C2 are found by pixel interpolation based on a plurality of differential signals Dx around peaks. Then, the peak positions of a first peak P1 and a second peak P2 are calculated with $1/100$ resolution. A line width W1 of the line pattern is found as a distance between the first peak P1 and the second peak P2.

The aforementioned processing is performed for each of the divided areas. Then, the average value of the widths of the pattern calculated for the respective areas is defined as a length measurement value. In this manner, a more accurate width W1 of the line pattern can be found.

(Acquisition of an SEM Image with Wide Field of View and High Accuracy)

Figure 3A:
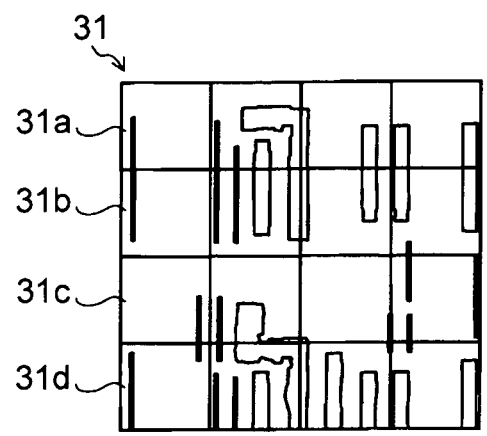
FIGS. 3A to 3C are diagrams for describing a concept of a method of acquiring an SEM image with wide field of view and high accuracy.
Figure 3B:
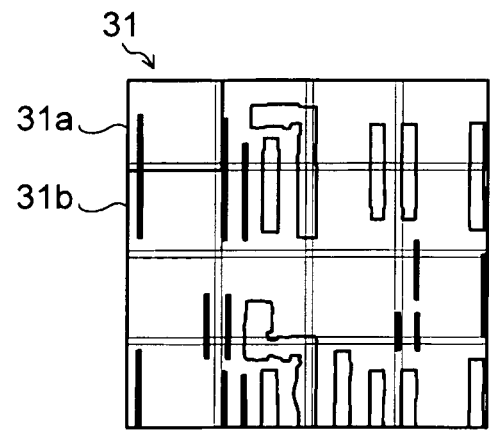
Figure 3C:
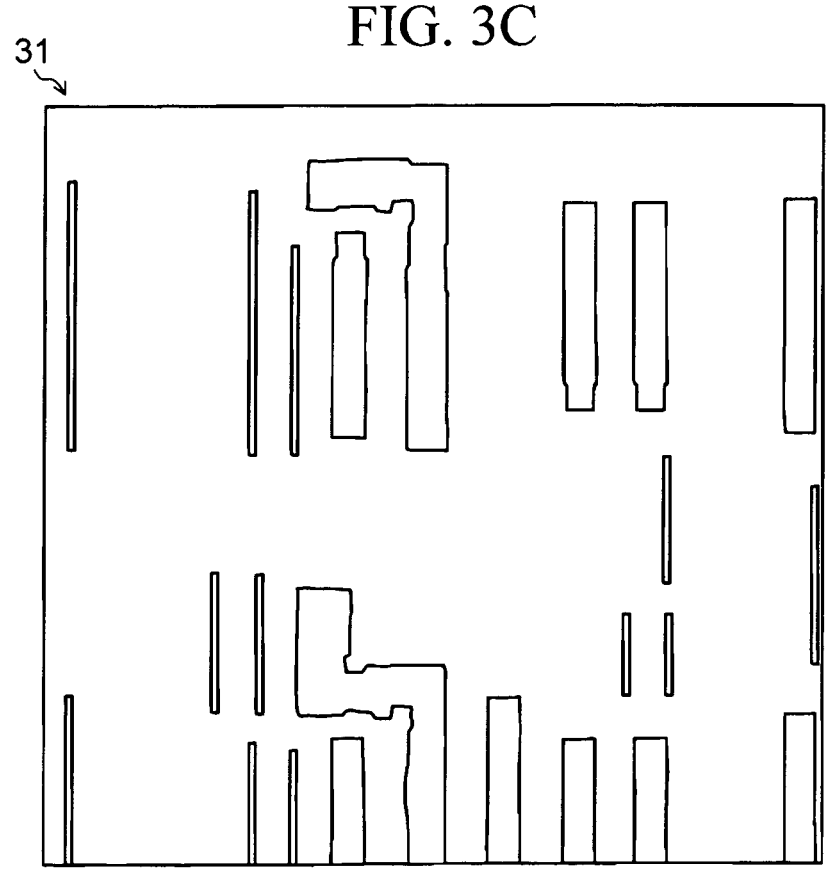

FIGS. 3A to 3C are diagrams for describing a concept of a method of acquiring an SEM image with wide field of view and high accuracy. FIG. 3A illustrates an example in which a desired area 31 is specified from a pattern formed on a sample. In order to acquire an SEM image of the entire specified area 31, there are a case of capturing the entire SEM image at once, and the other case of first dividing the specified area into several areas, capturing SEM images of the divided areas, and then combining them to acquire an SEM image of the entire area.

In a case where an SEM image of the entire specified area is acquired at once, the SEM image can be acquired in a short period of time. However, if the specified area is a wide area, aberrations increase as the area becomes distant from the optical axis. Accordingly, the accuracy of the acquired SEM image is degraded.

When a scanning electron microscope is used as a mask inspection apparatus, it is capable of checking whether or not a pattern formed as a mask has a defect such as discontinuity by use of the acquired SEM image. However, in case of conducting a highly accurate inspection such as an inspection based on comparison with a pattern model by a mask simulation, highly accurate acquisition of an SEM image is required. For this reason, in this embodiment, in order to achieve highly accurate acquisition of an SEM image with wide field of view, a specified area is divided into a plurality of areas where SEM images with high accuracy can be acquired, and then, the divided SEM images of the respective divided areas are combined to acquire an overall SEM image with wide field of view.

In FIG. 3A, the specified area 31 is divided into 16 areas (31a, 31b and so forth) in order that an SEM image with high accuracy can be acquired in each of the divided areas. Actually, as illustrated in FIG. 3B, the specified area 31 is divided in such a way that divided areas adjacent to each other have an overlap area where the adjacent divided areas overlap with each other. Then, the SEM images with high accuracy, which are acquired in the respective divided areas, are subjected to alignment processing using coordinate data of the divided areas and edge information of a pattern existing in the overlap areas. Thus, the divided SEM images are combined to acquire an SEM image with wide field of view and high accuracy as illustrated in FIG. 3C.

Figure 4A:
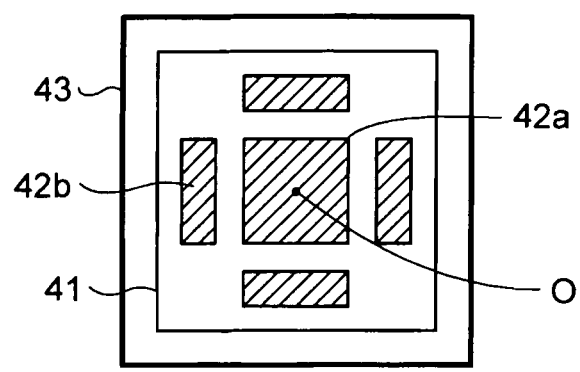
FIGS. 4A and 4B are diagrams for describing division for acquiring an SEM image with wide field of view and high accuracy.
Figure 4B:
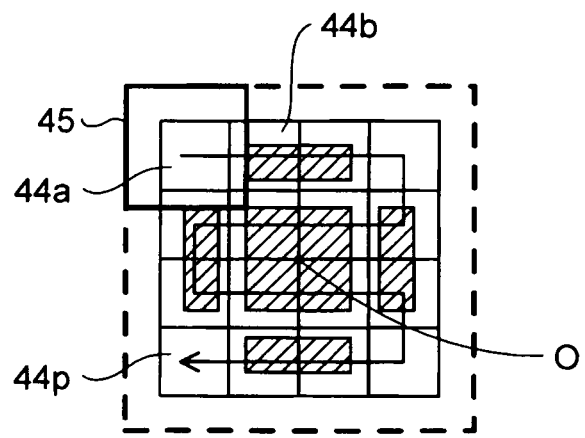

FIGS. 4A and 4B are diagrams illustrating an SEM image of a sample in which a pattern is formed. FIG. 4A is a wide field SEM image with a low magnification. FIG. 4B is a diagram illustrating a division method.

FIG. 4A illustrates an image on which the entire desired area 41 is photographed in a wide field range 43 with a magnification of 10K. In the desired area 41, there are indicated an image 42a of a pattern formation area and images 42b of pattern formation areas existing around the image 42a while being apart from the image 42a. The desired area 41 is an area of 10×10 μm, for example.

The number of divided areas is calculated for the desired area 41 in FIG. 4A, and SEM images with high accuracy are acquired for the respective divided areas. The number of divided areas is determined in accordance with a predetermined size that can capture an image with high accuracy. For example, in FIG. 4B, the size that allows each image to be captured highly accurately is set to 2.5×2.5 μm, and the desired area is divided into 16 areas. The images are captured with a magnification of 50K from a divided area 44a to a divided area 44p in a predetermined sequence (sequence indicated by the arrow of FIG. 4B). Here, the images are captured with an image capturing range 45 which is set larger than each of the divided areas so that adjacent divided areas can overlap with each other.

Figure 5A:
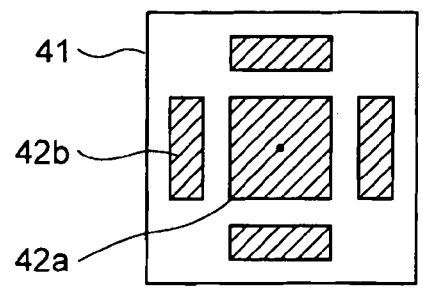
FIGS. 5A to 5D are diagrams for describing combination of divided images with high accuracy into an SEM image with wide field of view and high accuracy.

FIGS. 5A to 5D are diagrams illustrating an overview of the processing to acquire an SEM image with wide field of view and high accuracy. FIG. 5A is a wide field SEM image acquired with a low magnification. The images 42a and 42b of pattern formation areas are illustrated in the desired area 41. When a point in the pattern 42a of the SEM image is specified, a divided SEM image acquired with a high magnification and corresponding to this point is extracted.

Figure 5B:
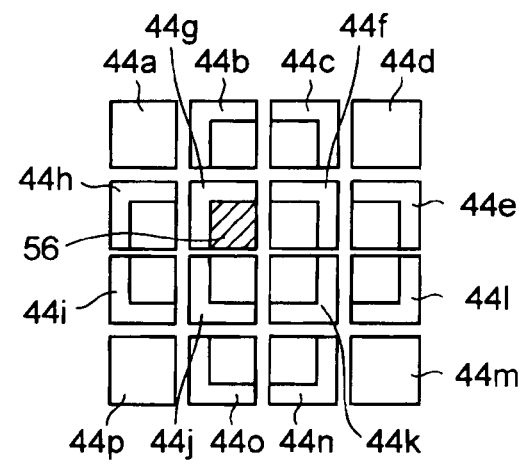
Figure 5C:
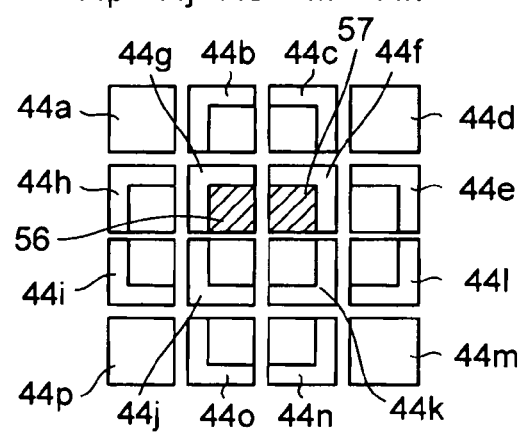

FIG. 5B is a diagram illustrating the respective images of the divided areas 44a to 44p. By detecting where the same coordinate data as that of the specified point of FIG. 5A is included, the corresponding specified point is found. In this example, it is assumed that the specified point is included in a pattern image 56 of the divided area 44g of FIG. 5B. In the pattern image 56 of the divided area 44g, the specified point is determined to be a pattern formation area (non-transparent area) on the basis of a relationship corresponding to the wide field SEM image.

The combination processing is performed on this divided image and divided images adjacent to this divided image. The combination processing is performed in accordance with a predetermined sequence. For example, the combination processing to combine the divided area 44g and the divided area 44f adjacent on the right is performed first. Next, the combination processing to combine the divided area 44f and the divided area 44k positioned below the divided area 44f is performed. The combination processing is repeated in this manner for each two adjacent divided areas in such a way that the divided area 44g including the initial specified point is surrounded, thus combining all the divided areas.

Figure 5D:
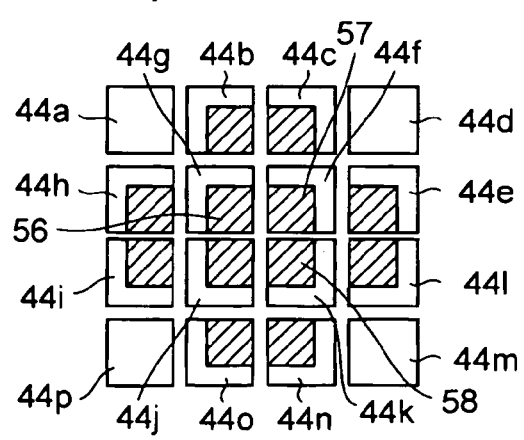

When a pattern image 57 of the divided area 44f is determined to be in the same pattern formation area as that of the pattern image 56 of the divided area 44g, both of the divided areas are combined on the basis of coordinate information of the pattern images 56 and 57. This processing is performed on the divided images in a predetermined sequence. The coordinates of the periphery of each of the pattern formation areas are corrected as illustrated in FIG. 5D to combine the divided images into an SEM image with wide field of view and high accuracy.

Here, detection of the coordinates of the periphery of the pattern enables to distinguish the pattern formation area including the specified point from the outside portion of the area, and thereby to detect a pattern formation area of the same type (non-transparent area or transparent area) as the pattern formation area including the specified point in the overlap area between the divided areas.

Figure 6:
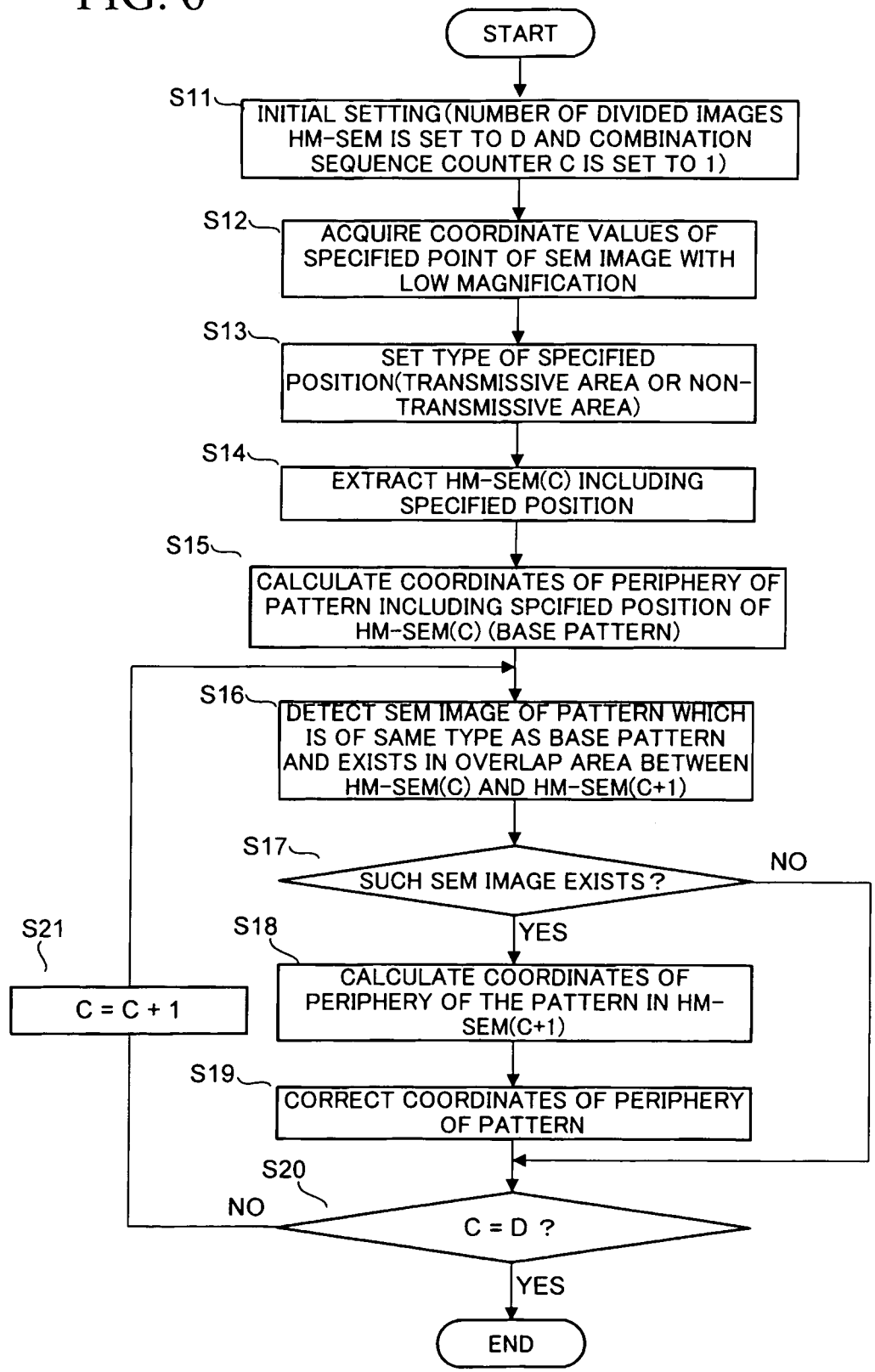
FIG. 6 is a flowchart illustrating an example of image acquisition processing to acquire an SEM image with wide field of view and high accuracy.

Next, the processing to acquire an SEM image with wide field of view and high accuracy is described with reference to FIGS. 6 to 9. FIG. 6 is a flowchart illustrating an example of the image acquisition processing to acquire an SEM image with wide field of view and high accuracy. FIGS. 7A to 9 are diagrams for describing the processing to combine the divided areas. FIGS. 7A to 7C and FIGS. 8A to 8C illustrate a portion including the divided areas 44g, 44f, 44k and 44j of FIG. 5B. In FIGS. 7A-7C and 8A-8C, the divided areas 44g, 44f, 44k and 44j of FIG. 5B correspond to divided areas DA1, DA2, DA3 and DA4, respectively, and overlap areas existing between adjacent divided areas are shown as well. FIG. 9 further illustrates divided areas DA5 and DA6 corresponding to the divided areas 44h and 44i of FIG. 5B, respectively.

Here, the following assumptions are made in the image acquisition processing of FIG. 6. The center X and Y coordinate values and the field of view for the target wide field SEM image are already specified. Moreover, the required number of divided areas is already calculated on the basis of the size of the wide field area, and the size of the area which enables to acquire a highly accurate SEM image. In addition, the SEM image with a low magnification in accordance with the field of view and the divided SEM images with a high magnification in the respective divided areas are already acquired. Furthermore, the sequence to combine the divided images is previously defined.

First, the initial setting is made in step S11. In this initial setting, the number of divided images HM-SEM is set to D, and the counter C of the divided areas for the sequence to combine the divided images HM-SEM is set to 1.

Next, in step S12, the coordinate values of a specified point of the SEM image with a low magnification are acquired.

In step S13, the type of the specified position is set. This type specifies whether the area including the specified position belongs to the non-transparent area in which the pattern is formed and which is displayed in black as an SEM image, or to the transparent area in which no pattern is formed and which is displayed in a lighter color than that of the non-transparent area as an SEM image.

In step S14, a divided image HM-SEM(C) including the specified position is extracted. Since the divided images are already acquired and stored in the storage unit 55, the corresponding divided image is extracted from the storage unit 55.

In step S15, the coordinates of the periphery of a pattern including the specified position of the divided image HM-SEM(C) (referred to as a base pattern) are calculated. The coordinates of the periphery of the image 42a of the pattern formation area existing in each of the divided areas DA1 to DA4 are calculated. The extraction of the coordinates (edges) of the periphery of the pattern will be described later in detail.

In step S16, an SEM image of a pattern of the same type as the base pattern in the overlap area between the divided image HM-SEM(C) and a divided image HM-SEM(C+1) adjacent thereto is detected.

In step S17, whether this SEM image exists or not is determined. If such an SEM image exists, the processing moves to step S18, and if not, the processing moves to step S20.

In step S18, the coordinates of the periphery of the pattern in the divided image HM-SEM(C+1) are calculated.

Figure 7A:
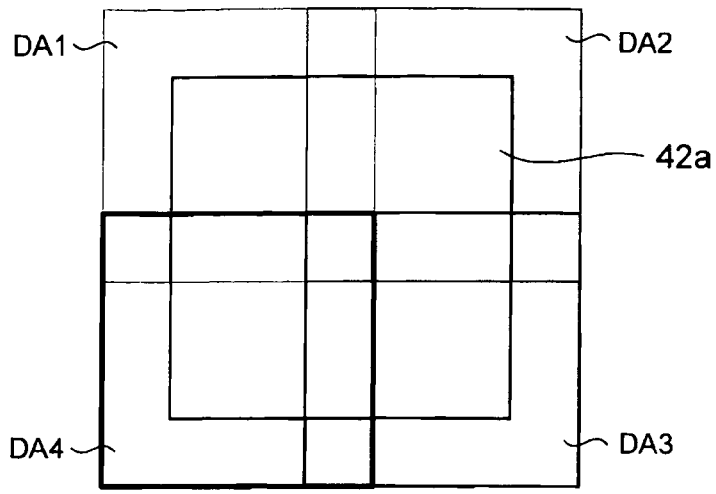
FIGS. 7A to 7C are diagrams (part 1) for describing processing to combine divided images.
Figure 7B:
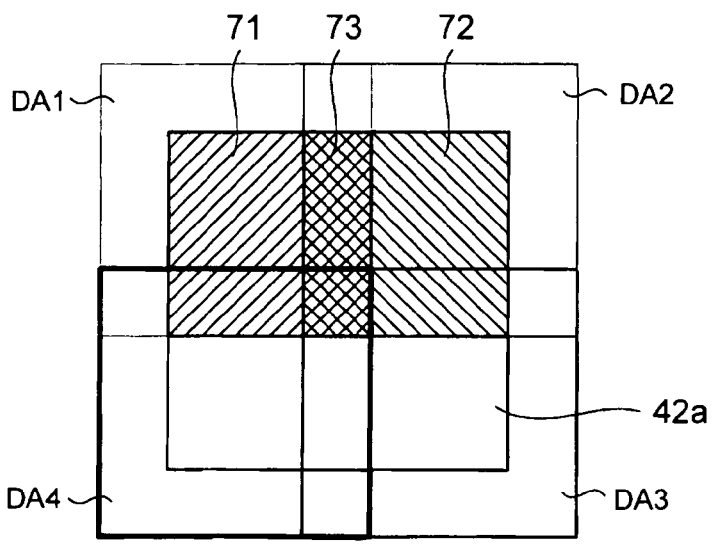
Figure 7C:
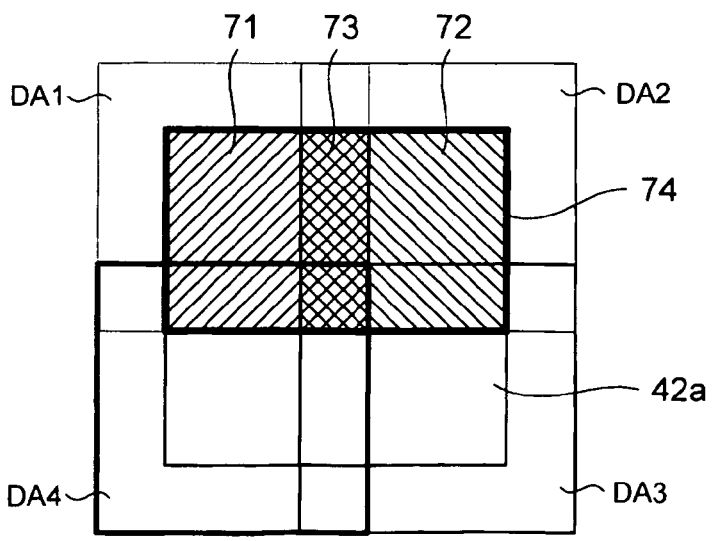

In FIG. 7B, the divided area DA1 and the divided area DA2 adjacent thereto are the targets for the combination processing. An overlap area 73 exists between a pattern area 71 in the divided area DA1 and a pattern area 72 in the divided area DA2. Thus, the coordinates of the periphery of the pattern 72 in the divided area DA2 are calculated.

In step S19, the coordinate values of the periphery of the pattern are corrected. Since it is determined that the pattern area 71 in the divided area DA1 and the pattern area 72 in the divided area DA2 reside in the same pattern area, the coordinate data pieces for the overlapping sides of the overlap area 73 are corrected to coincide with each other. As a result, the coordinates of the periphery of the combined pattern are updated as illustrated with a periphery 74 of FIG. 7C.

Figure 8A:
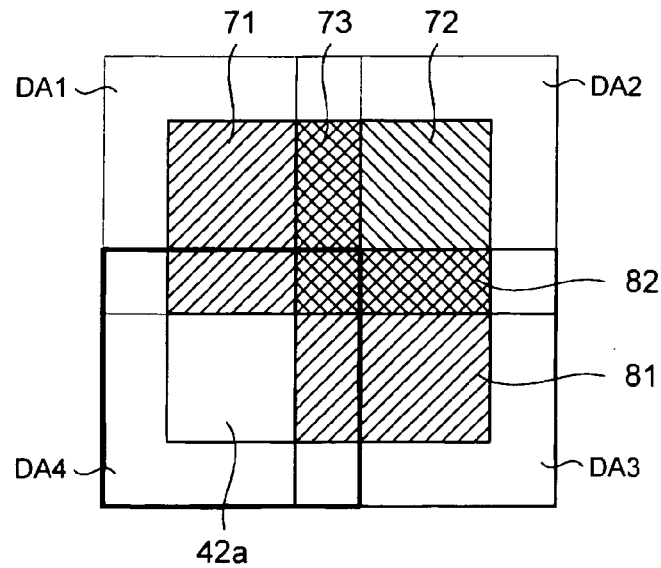
FIGS. 8A to 8C are diagrams (part 2) for describing the processing to combine divided images.
Figure 8B:
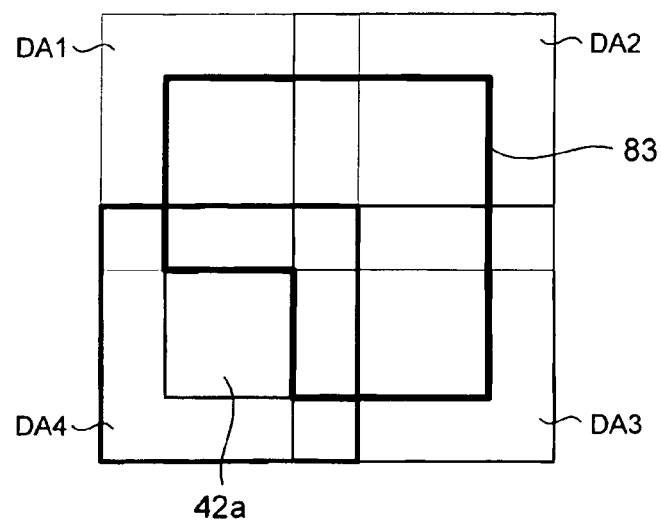
Figure 9:
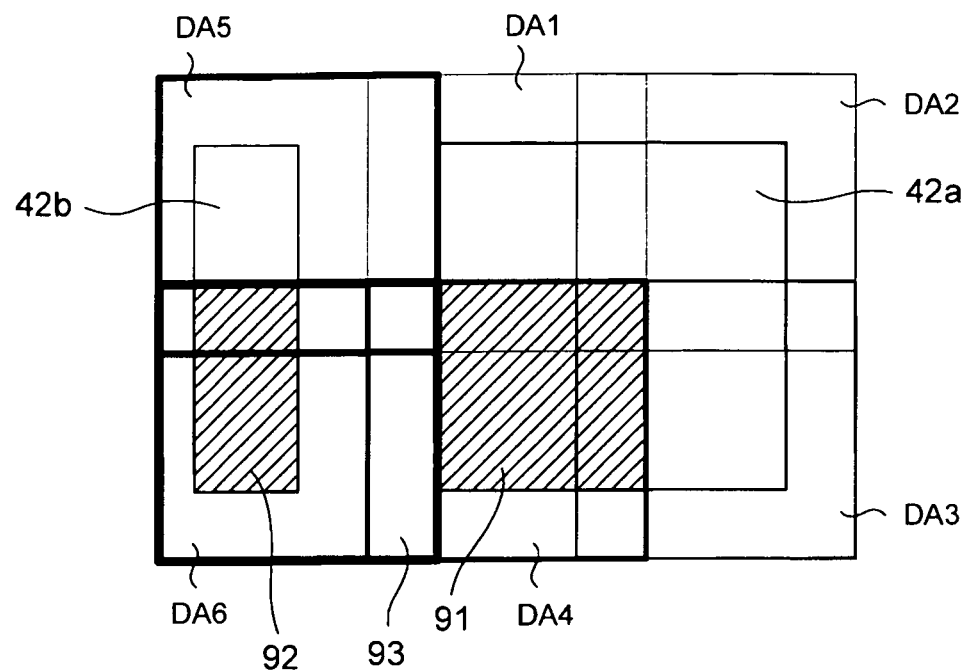
FIG. 9 is a diagram for describing processing to combine divided images when no pattern exists in an overlap area.

FIG. 8A is a diagram for describing the combination processing to combine the divided area DA2 and the divided area DA3. FIG. 8A illustrates a case where an overlap area 82 exists between the pattern area 72 in the divided area DA2 and a pattern area 81 in the divided area DA3, and the pattern area 72 and the pattern area 81 are determined to be in the same pattern area. In this case, as in the case of FIG. 7C, the coordinate data pieces for the overlapping sides of the pattern area are corrected to coincide with each other. As a result, the coordinates of the periphery of the combined pattern are updated as illustrated with a periphery 83 of FIG. 8B.

Figure 8C:
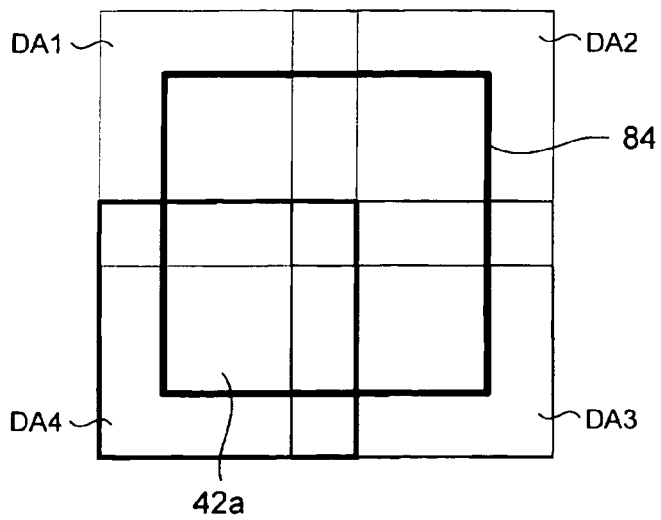

FIG. 8C illustrates a situation where the combination processing for the divided area DA1 to the divided area DA4 is completed, and the coordinates of a periphery 84 of the pattern 42a are updated.

FIG. 9 illustrates a situation where a pattern of the same type as the base pattern does not exist in an overlap area. Although a pattern area 91 exists in the divided area DA4 and a pattern area 92 exists in the divided area DA6, no pattern area exists in an overlap area 93. In this case, the two adjacent divided areas are combined on the basis of the coordinate data of the divided areas.

In step S20, whether or not the aforementioned processing is performed for all of the divided images is determined. If the processing is not yet performed for all of the divided images, the counter C is incremented by 1 in step S21, and then, the aforementioned processing is performed for the next adjacent divided image. If the processing is performed for all of the divided images, the image acquisition processing for an SEM image with wide field of view and high accuracy is terminated.

With the image combination processing described above, an SEM image of a mask in a specified region is outputted in a highly accurate manner even when the SEM image is a wide field image.

Figure 10:
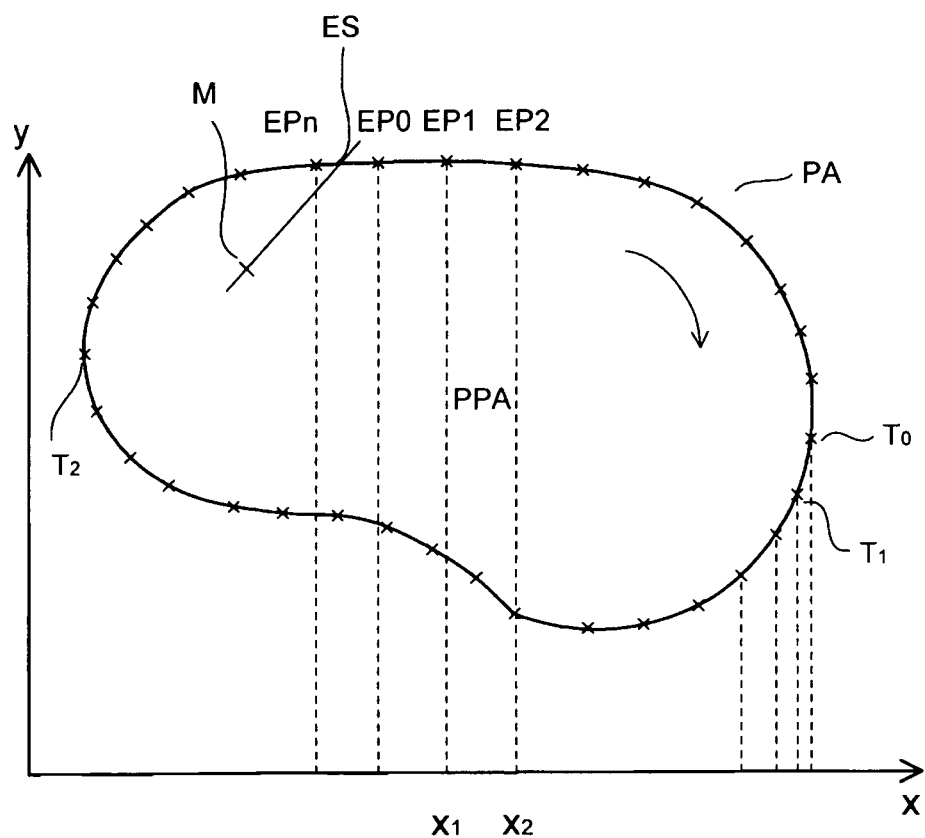
FIG. 10 is a diagram for describing a method of measuring edges of a pattern.
Figure 11:
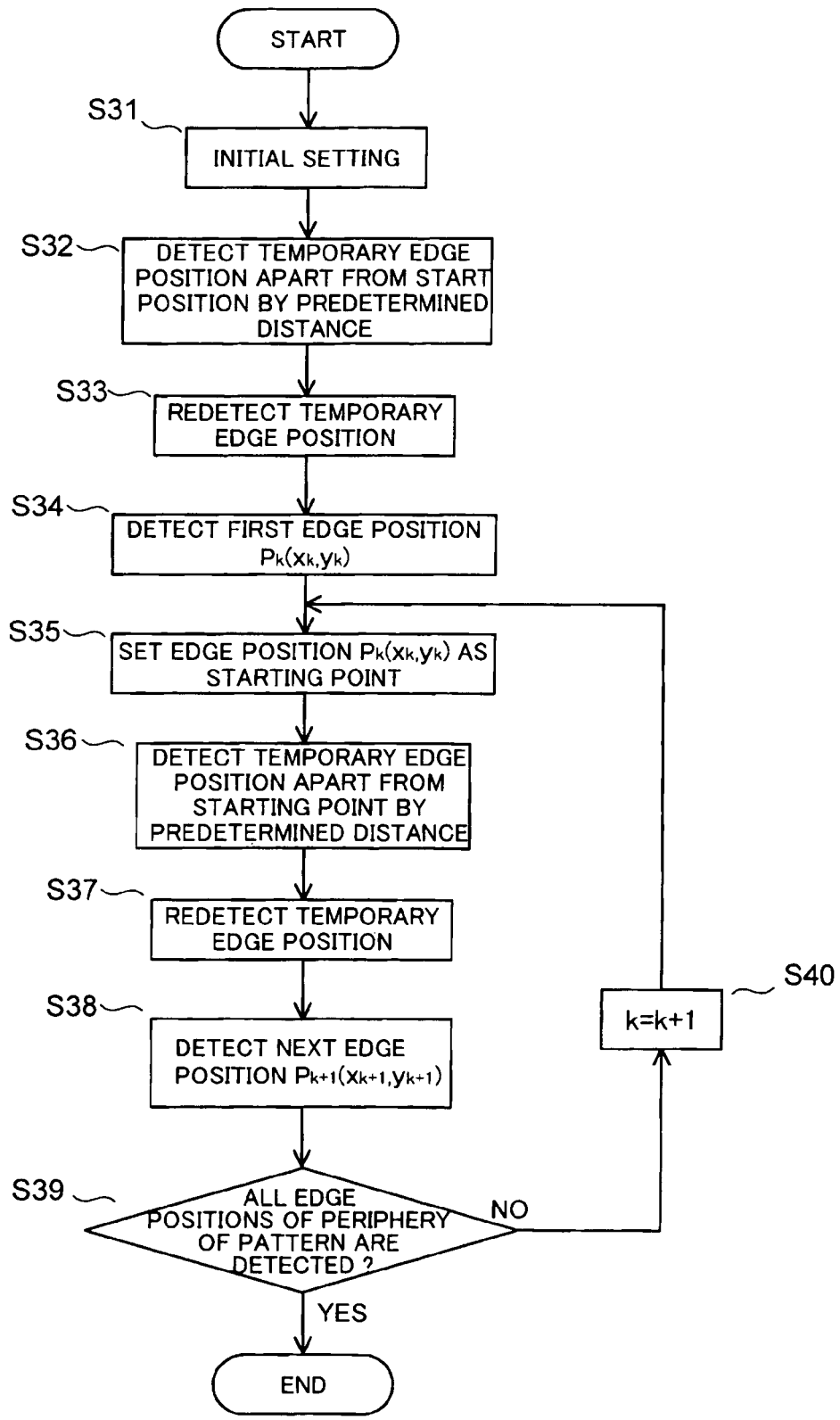
FIG. 11 is a flowchart illustrating an example of processing to detect edge positions of a periphery of a pattern.

Hereinafter, a description is given of the calculation of the coordinates of the periphery of a pattern, which is performed in steps S15 and S18. Here, edge detection processing for the periphery of a pattern (calculation of the coordinates of a periphery) is described with reference to FIG. 11 and FIGS. 12A to 12D while a pattern having a shape illustrated in FIG. 10 is used as an example. FIG. 11 is a flowchart illustrating an example of the edge detection processing for the periphery of a pattern. In addition, FIGS. 12A to 12D are diagrams for describing the edge detection for the periphery of a pattern. Here, it is supposed that a start position ES to detect edge positions of the periphery of a pattern is determined in advance.

First, the initial setting is made in step S31 of FIG. 11. In the initial setting, a predetermined interval for detecting edges of the periphery of a pattern is specified (hereinafter, referred to as a specified step). For example, the specified step is set to a distance corresponding to a predetermined number of pixels. In addition, a counter k indicating the position of a detection edge of the periphery of the pattern is set to 0.

In steps S32 to S34, an edge position located apart from the start position ES by a predetermined specified step d is detected.

Figures 12A, 12B, 12C, 12D:
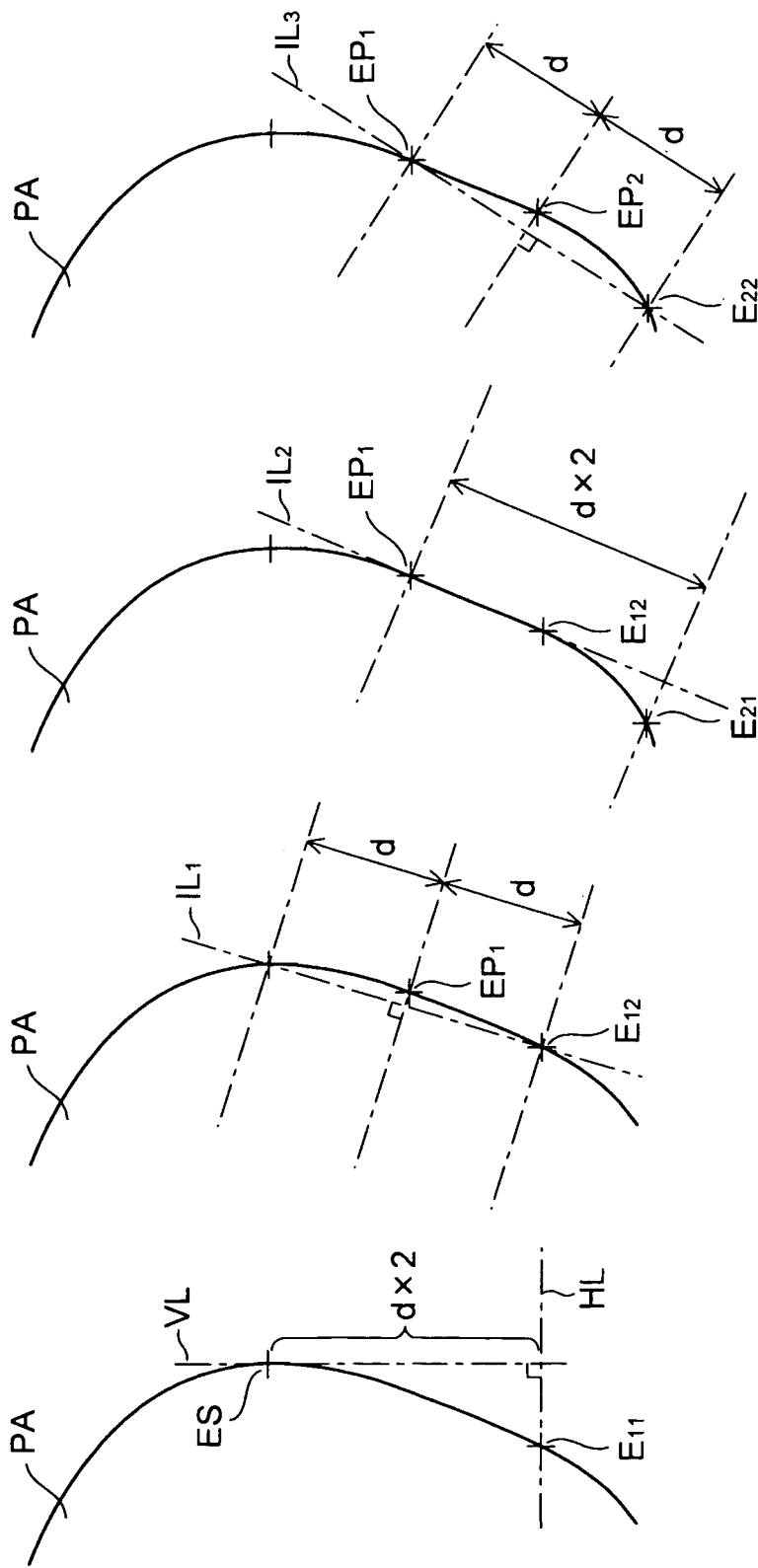
FIGS. 12A to 12D are diagrams for describing a method of detecting edge positions of a periphery of a pattern.

In step S32, a temporary edge is detected at a position apart from the start position ES by a distance (specified step d×2). Specifically, as illustrated in FIG. 12A, a line profile is created using a line HL as the reference line for creating the line profile, and an edge $E_{11}$ is detected. Here, the line HL orthogonally crosses a straight line VL at a position apart from the start position ES by a distance (specified step d×2), and the straight line VL extends downward (−Y direction) in FIG. 12A. The detected edge $E_{11}$ is termed as a temporary detection edge $E_{11}$. Note that, in exchange for detecting the edge in −Y direction from the start position ES in FIG. 12A, the edge may be detected in X direction from the start position ES depending on the shape of the pattern.

In step S33, the temporary detection edge $E_{11}$ detected in step S32 is redetected. The start position ES and the temporary detection edge position $E_{11}$ are connected each other with a straight line $IL_1$, followed by finding a position apart from the start position ES by the distance (specified step d×2) on the straight line as shown in FIG. 12B. A line orthogonally crossing the straight line at the position is set as a reference line. Then, a line profile on the reference line is created, and the temporary detection edge position is redetected as denoted by $E_{12}$. By the redetection of this temporary detection edge position $E_{12}$, the distance from the start position ES is made closer to the distance (specified step d×2).

Next, in step S34, a first edge position is detected. The start position ES and the redetected temporary detection edge position $E_{12}$ are connected each other with the straight line $IL_1$. Then, a line profile is found on a line orthogonally crossing the straight line $IL_1$ at an intermediate position $MP_1$, i.e., the specified step d from the start position ES, and an edge $EP_k$ $(x_k, y_k)$ is detected. In FIG. 12B, an edge $EP_1$ is detected as the first edge. Detection of the edge $EP_k$ $(x_k, y_k)$ as described above enables to detect the edge on the line nearly perpendicular to the periphery of the pattern. Thus, the edge position can be accurately detected.

In step S35, the edge $EP_k$ $(x_k, y_k)$ is set to the starting point for the next edge detection. In FIG. 12C, the edge $EP_1$ is set to the starting point.

From step S36 to step S38, an edge position $EP_{k+1}$ $(x_{k+1}, y_{k+1})$ apart from the starting edge position $EP_k$ $(x_k, y_k)$ by the specified step d is detected.

In step S36, the starting point $EP_1$ and the redetected temporary detection edge $E_{12}$ are connected each other with a straight line $IL_2$, followed by finding a position apart from the starting point $EP_1$ by the distance (specifying step d×2) on the straight line $IL_2$. A line orthogonally crossing a straight line $IL_2$ at the position is set as a reference line. Then, a line profile is created on the basis of the reference line and an edge is detected. The edge detected here is termed as a temporary detection edge $E_{21}$ as shown in FIG. 12C.

In step S37, in the same manner as step S34, the starting point $EP_1$ and the temporary detection edge $E_{21}$ are connected each other with a straight line $IL_3$, followed by finding a position apart from the starting point $EP_1$ by the distance (specifying step d×2) on the straight line. A line orthogonally crossing the straight line $IL_3$ at the position is set as a reference line. Then, the line profile on the reference line is created, and the temporary detection edge position $EP_{22}$ is redetected.

Next, in step S38, the starting point $EP_1$ and the redetected temporary detection edge $EP_{22}$ are connected each other with the straight line $IL_3$. Then, a line profile is found on a line orthogonally crossing the straight line $IL_3$ at an intermediate position $MP_2$, and the edge $EP_{k+1}$ is detected. In FIG. 12D, the edge $EP_2$ is detected as the second edge.

In step S39, it is determined whether or not all of the edges on the periphery of the pattern are detected. If it is determined that all of the edges are detected, the processing is terminated. If it is determined that all of the edges are not yet detected, the processing moves to step S40.

In step S40, k=k+1 is set to move to step S35, and the next edge position is detected.

By the aforementioned processing, the edge positions of the periphery of the pattern are detected in the order of the $EP_0$, $EP_1$, . . . as illustrated in FIG. 10. When the edges on the periphery of the pattern are detected in the manner described above, the detected edge position and a temporary edge position apart from the detected edge position by a predetermined interval are connected with a straight line, followed by finding a line orthogonally crossing the straight line at the intermediate position, and then the next edge position is detected from the line profile on the line. Accordingly, the processing detects the edge on the line nearly perpendicular to the periphery of the pattern, thereby enabling to detect the accurate edge positions.

Next, the processing to acquire an SEM image with wide field of view and high accuracy is described for a case where a plurality of pattern formation areas exist in a divided area with reference to FIG. 13 and FIGS. 14A to 14D.

Figure 13:
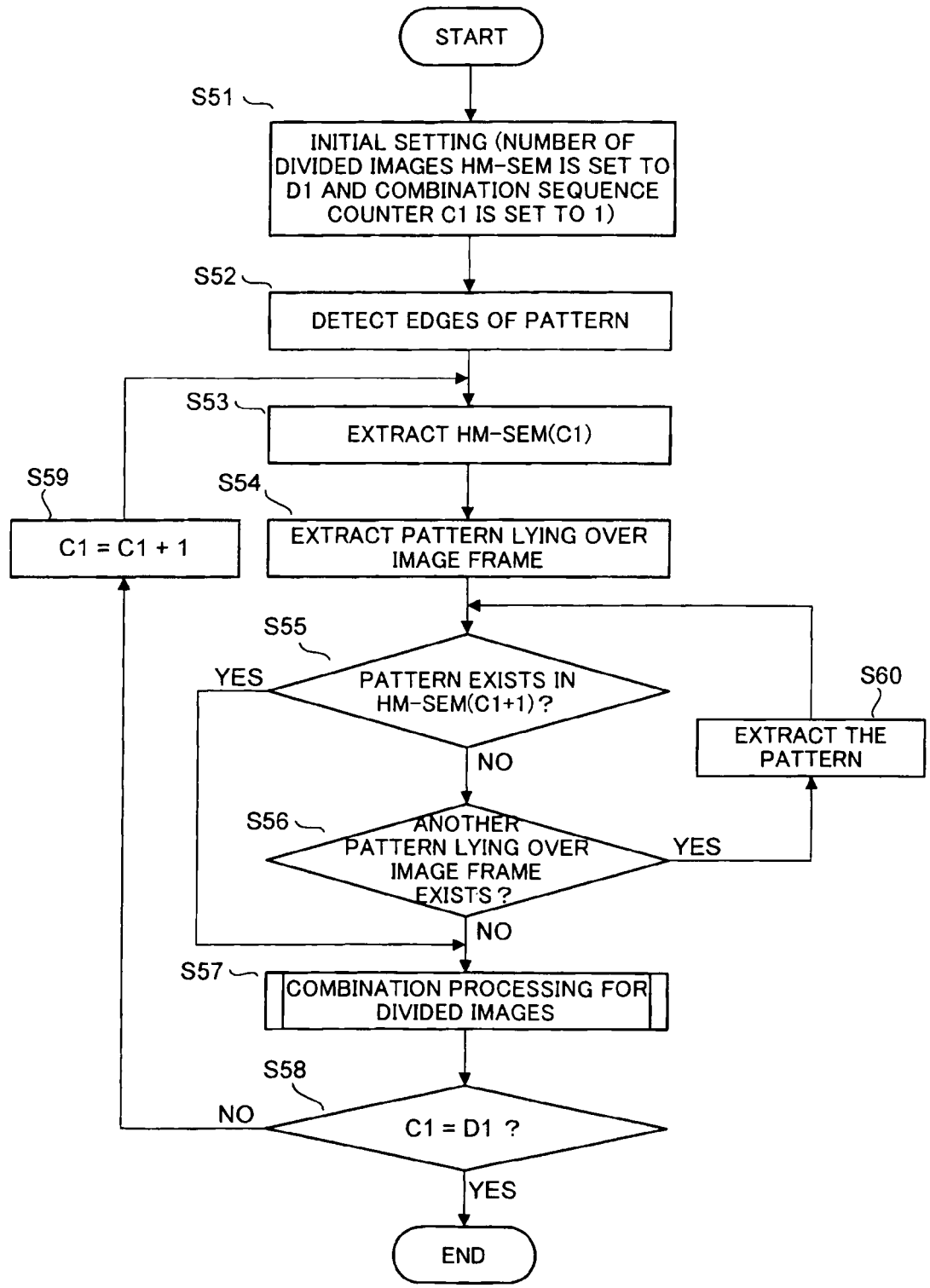
FIG. 13 is a flowchart illustrating an example of image acquisition processing to acquire an SEM image with wide field of view and high accuracy when a plurality of patterns exist in a divided image.

Here, the following assumptions are made in the image acquisition processing of FIG. 13. The center coordinate values and the field of view of the target wide field SEM image are already specified. Moreover, the required number of divided areas is already calculated on the basis of the size of the wide field area, and the size of the area which enables highly accurate acquisition of an SEM image. In addition, the SEM image with a low magnification in accordance with the field of view and the divided SEM images with a high magnification in the respective divided areas are already acquired and stored in the storage unit 55. Furthermore, the sequence to combine the divided images is previously defined.

First, the initial setting is made in step S51 of FIG. 13. In this initial setting, the number of divided images HM-SEM is set to D1, and the counter C1 for the sequence to combine the divided images HM-SEM is set to 1.

In step S52, the edges of patterns are detected. This edge detection is performed for the patterns as target existing in all of the divided areas. The edges of the patterns are detected for each of the divided areas from an acquired SEM image. In this edge detection, edge detection to distinguish between an area where a pattern is formed and an area where no pattern is formed is performed by binarizing the SEM image and then detecting a pixel having a discontinuous value, for example. Then, the precise edge detection as described in FIG. 10 to FIG. 12D is performed on the detected pattern formation areas.

Figure 14A:
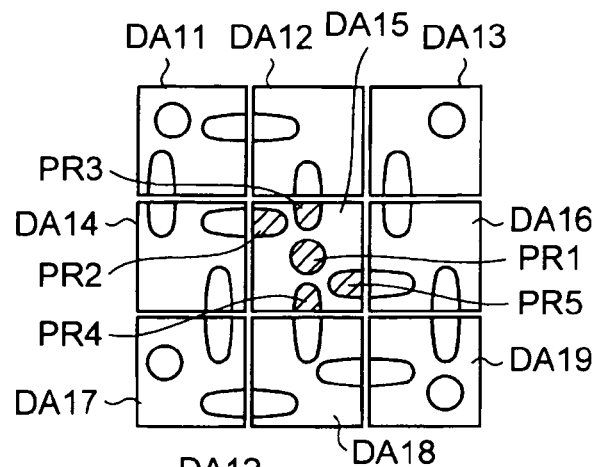
FIGS. 14A to 14D are diagrams for describing processing to acquire an SEM image with wide field of view and high accuracy when a plurality of patterns exist in a divided image.

In step S53, one HM-SEM (C1) is extracted from the storage unit 55. FIG. 14A illustrates a divided area DA15 extracted from among divided areas DA11 to DA19 obtained by dividing an area into nine pieces. In the divided area DA15, pattern formation areas PR1 to PR5 are illustrated.

In step S54, a pattern lying over an image frame is extracted. In FIG. 14A, it is supposed that the sequence of the combination processing is defined as DA15→DA14→DA11→DA12→DA13→DA16→DA19→DA18→DA17. In this case, a pattern PR2 is detected as a pattern lying over the image frame of the divided area DA15 on the side adjacent to the divided area DA14 which is to be combined with the divided area DA15.

In step S55, whether or not a pattern exists in HM-SEM (C1+1) is determined. In the case of FIG. 14A, whether or not a pattern corresponding to the pattern PR2 exists in the divided area DA14 is detected. If such a pattern exists, the processing moves to step S57, and if no such pattern exists, the processing moves to step S56.

In step S56, whether or not another pattern lying over the image frame is determined. If a pattern lying over the image frame exists, the processing moves to step S60 and this pattern is extracted. Then, the processing continues to the processing of step S55. If a pattern lying over the image frame does not exist, the processing moves to step S57.

In step S57, the combination processing for the divided images is performed. This combination processing is performed in the same manner as the processing from steps S16 to S19 of FIG. 6.

Figure 14B:
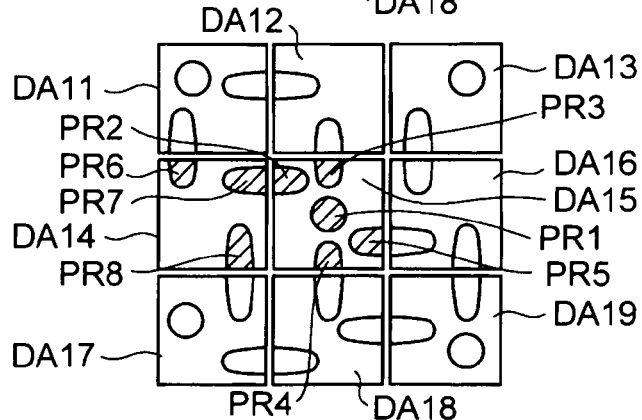

FIG. 14B illustrates a result of performing the combination processing to combine the divided area DA15 and the divided area DA14. The pattern PR2 in the divided area DA15 and a pattern PR7 in the divided area DA14 are determined to belong to the same pattern, and thus, the divided area DA15 and the divided area DA14 are combined. In this combination processing, the coordinates of the peripheries of the pattern PR2 and the pattern PR7 are updated. In addition, the type of the pattern is determined to be different between the inside and outside of the pattern PR7. Then, the type of the pattern in the outside of the pattern PR7 is determined to be different from the type of a pattern PR6 and a pattern PR8. As a result, the pattern PR6, the pattern PR7 and the pattern PR8 are all determined to be the same type.

Figure 14C:
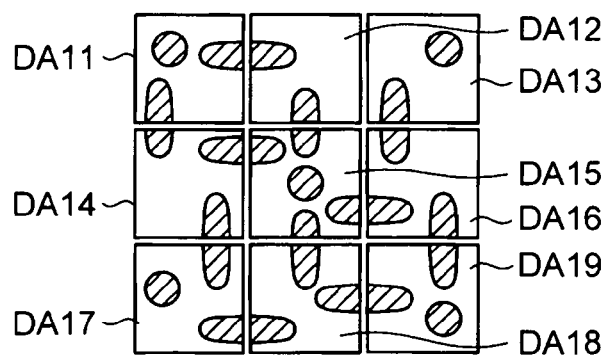

FIG. 14C illustrates a state where the entire combined image is acquired by performing the same processing as the processing described above, and the processing to detect all the patterns in each of the divided areas and to adjust the coordinate values.

In step S58, whether or not the aforementioned processing is performed for all of the divided areas is determined. If the processing is not yet performed for all of the divided areas, the counter C1 is incremented by 1 in step S59, and the aforementioned processing is performed for the next adjacent divided area. If the processing is performed for all of the divided areas, the image acquisition processing is terminated.

Figure 14D:
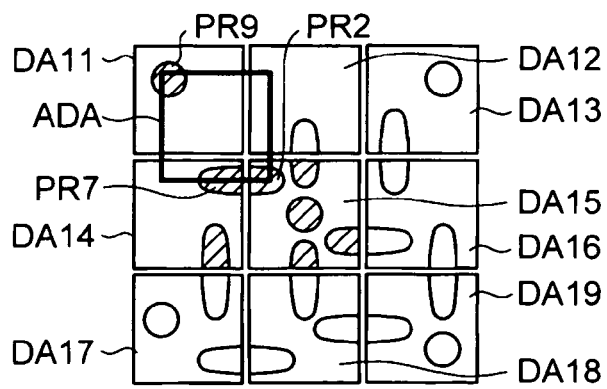

Note that FIG. 14D illustrates the handing of a case where no pattern exists in the overlap area of the adjacent divided areas. If no pattern exists in the overlap area, a divided area is further set so as to include a pattern, and the image thereof is acquired. The divided areas are connected together on the basis of this image, and the coordinate information of the original isolated pattern is also updated.

As described above, in this embodiment, the specified observed area of the sample is automatically divided into divided areas in such a way that adjacent divided areas overlap with each other, and then, SEM images with high accuracy are acquired in the respective divided areas. When the divided areas are to be combined, the image of the divided area corresponding to the one specified point of a pattern in the wide field SEM image is extracted. Then, adjacent divided areas are automatically combined in a predetermined sequence to acquire a wide field SEM image of the specified area.

In this manner, the specified wide area is divided into the narrow areas, and then, the SEM images thereof with high accuracy are acquired. In addition, the coordinate positions are corrected by using the coordinate information of the divided areas and edge information of the pattern between the divided areas. Thus, the SEM images can be combined in a highly accurate manner. Moreover, by detecting a pattern involved with combination of divided areas by specifying only one point of a pattern in the wide field SEM image, and then automatically combining the divided areas, it is possible to acquire an SEM image with wide field of view and high accuracy at a high speed.

Note that it is also possible to conduct a defect inspection of a mask pattern in the following manner. Specifically, general data stream (GDS) data is generated from the aforementioned wide field SEM image data. Then, the GDS data is fed back to a mask design simulator and thereafter compared with design data.

What is claimed is:

1. A mask inspection apparatus comprising:
   irradiation means for irradiating a sample with an electron beam;
   electron detection means for detecting a quantity of electrons generated from the sample having a pattern formed thereon by the irradiation with the electron beam;
   image processing means for generating image data of the pattern on the basis of the quantity of the electrons;
   storage means for storing therein the image data; and
   control means for calculating a number of divided images, which form an entire combined image, on the basis of a size of a specified observed area of the sample, determining divided areas in such a way that divided images adjacent to each other overlap with each other, acquiring the divided images of the respective divided areas, and storing the divided images in the storage means, wherein
   the control means extracts two divided images adjacent to each other in a predetermined sequence starting from a specified one of the divided images of the respective divided areas stored in the storage unit,
   for each of the two divided images adjacent to each other, the control means then detects an image of a same pattern formation area included in an overlap area between the two divided images adjacent to each other, and determines the detected image to be a combination reference image, and
   the control means then combines the two divided images adjacent to each other on the basis of the combination reference image to thereby form an entire SEM image of the observed area.

2. The mask inspection apparatus according to claim 1, wherein, from the overlap area of the two divided images adjacent to each other, the control means detects an image of an area having image information equivalent to image information of an area specified in the specified one of the divided images.

3. The mask inspection apparatus according to claim 2, wherein the control means measures coordinate data of a periphery of the pattern formation area in each of the two divided images adjacent to each other before combining the two divided images adjacent to each other.

4. The mask inspection apparatus according to claim 3, wherein the control means corrects the coordinate data of the periphery of the pattern formation area included in each of the two divided images adjacent to each other on the basis of coordinate data of the combination reference image when combining the two divided images adjacent to each other.

5. The mask inspection apparatus according to claim 4, wherein, when a plurality of pattern formation areas exist in each of the divided areas, and two divided images adjacent to each other are defined as a divided image A and a divided image B to be combined with the divided image A, the control means sets an image of the pattern formation area as the combination reference image, the pattern formation area lying over a frame of the divided image A on a side adjacent to the divided image B.

6. The mask inspection apparatus according to claim 1, wherein, when the image of the same pattern formation area does not exist in the overlap area of two divided images adjacent to each other, the control means form the two divided images adjacent to each other on the basis of coordinate data of the divided images.

7. An image generation method in a mask inspection apparatus including irradiation means for irradiating a sample with an electron beam, electron detection means for detecting a quantity of electrons generated from the sample having a pattern formed thereon by the irradiation with the electron beam, image processing means for generating image data of the pattern on the basis of the quantity of the electrons, and storage means for storing therein the image data, the method comprising the steps of:
   calculating a number of divided images, which form an entire combined image, on the basis of a size of a specified observed area of the sample, and determining divided areas in such a way that divided images adjacent to each other overlap with each other;
   acquiring the divided images of the respective divided areas;
   extracting one specified divided image from the divided images of the respective divided areas;
   extracting two divided images in a predetermined sequence starting from the extracted one specified divided image;
   for each of the extracted two divided images adjacent to each other, determining a combination reference image by detecting an image of a same pattern formation area included in an overlap area between the adjacent divided images;
   combining the two divided images adjacent to each other on the basis of the combination reference image; and
   generating an entire SEM image.

8. The image generation method according to claim 7, wherein in the step of determining the combination reference image, an image of an area having image information equivalent to image information of an area specified in the specified one of the divided images is detected from the overlap area of the two divided images adjacent to each other and is set as the combination reference image.

9. The image generation method according to claim 7, further comprising a step of measuring coordinate data of a periphery of a pattern formation area in each of the adjacent divided images before the step of combining the divided images.

10. The image generation method according to claim 7, wherein the step of combining the divided images includes a step of correcting coordinate data of a periphery of a pattern formation area included in the adjacent divided images on the basis of coordinate data of the combination reference image.

11. The image generation method according to claim 7, wherein the step of combining the divided images includes a step of, when a plurality of pattern formation areas exist in each of the divided areas, and the two divided images adjacent to each other are defined as a divided image A and a divided image B to be combined with the divided image A, setting an image of the pattern formation area as the combination reference image, the pattern formation area lying over a frame of the divided image A on a side adjacent to the divided image B.

12. The image creation method according to claim 7, further comprising a step of, when the image of the same pattern formation area does not exist in the overlap area of the two divided images adjacent to each other, forming a divided image including the image of the pattern formation area included in one of the adjacent divided images.

* * * * *